United States Patent
Zhou et al.

(10) Patent No.: US 8,507,637 B2
(45) Date of Patent: Aug. 13, 2013

(54) PORPHYRIN COPOLYMER CONTAINING THIENOTHIADIAZOLE UNITS, PREPARATION METHOD AND USES THEREOF

(75) Inventors: Mingjie Zhou, Guangdong (CN); Jie Huang, Guangdong (CN); Yijin Liu, Guangdong (CN)

(73) Assignee: Ocean's King Lighting Science & Technology Co., Ltd., Nanshan, Shenzhen, Guangdong (CN)

( * ) Notice: Subject to any disclaimer, the term of this patent is extended or adjusted under 35 U.S.C. 154(b) by 0 days.

(21) Appl. No.: 13/702,105

(22) PCT Filed: Jun. 7, 2010

(86) PCT No.: PCT/CN2010/073597
§ 371 (c)(1),
(2), (4) Date: Dec. 5, 2012

(87) PCT Pub. No.: WO2011/153680
PCT Pub. Date: Dec. 15, 2011

(65) Prior Publication Data
US 2013/0096270 A1   Apr. 18, 2013

(51) Int. Cl.
*C08G 8/02*   (2006.01)

(52) U.S. Cl.
USPC ............ 528/216; 528/94; 528/117; 528/118; 528/54; 528/62; 528/64; 526/171; 526/239

(58) Field of Classification Search
USPC ................ 528/216, 94, 117, 118, 54, 62, 64; 526/171, 239
See application file for complete search history.

(56) References Cited

PUBLICATIONS

Li et al., Macromolecules 2006, 39, 456-461.*

* cited by examiner

*Primary Examiner* — Shane Fang
(74) *Attorney, Agent, or Firm* — Rankin, Hill & Clark LLP

(57) ABSTRACT

A porphyrin copolymer containing thienothiadiazole units, preparation method and uses thereof are disclosed. The copolymer has the structural formula (I), wherein: $R_1$, $R_2$, $R_3$, $R_4$ are same or different and each represents a $C_1$-$C_{32}$ alkyl; n is an integer of 1-100. The copolymer comprises fluorene units, thienothiadiazole units and porphyrin units, which enhance the density of electron cloud in copolymer skeleton, make the band-gap of the copolymer become narrow, thereby broaden the spectral response range of the copolymer, and improve the photoelectric transformation efficiency.

10 Claims, 2 Drawing Sheets

(I)

(I)

PORPHYRIN COPOLYMER CONTAINING THIENOTHIADIAZOLE UNITS, PREPARATION METHOD AND USES THEREOF

TECHNICAL FIELD

The present invention relates to the technical field of organic material, particularly, to a porphyrin copolymer containing thienothiadiazole units, the preparation method and the uses thereof.

BACKGROUND

The economy all over the world today is built on the basis of fossil fuel, such as coal, oil and natural gas. However, all of these non-reproducible fossil energies are continuously exhausted. Since the beginning of the 21st century, the global energy problems and the consequent problems of environmental pollution and climate warming are becoming more and more prominent and gradually intensified. Because of the outstanding advantages of wide and broad distribution, a large scale resources, pollution-free, clean, safe, and easy to obtain, the solar energy is considered to be one of the most promising renewable energy.

To take full advantage of the energy of sunlight, new type of materials for absorbing sunlight are continually developed, among others, the inorganic semiconductor materials are more widely developed and applied, such as employed in silicon cell for the ground, however, due to the complicated manufacturing process, high cost, its application is limited. Thus new type of organic optoelectronic materials for substitution of nonorganic material is seeked to reduce the cost and expand the range of applications.

In recent years, more and more researches have been focused on the organic photovoltaic materials which are employed on the optoelectronic devices such as organic solar cells. The organic solar cell is a new type of solar cell, which converts the solar energy into electrical energy. Compared to the disadvantages of limited source, expensive price, toxic, complicated manufacturing process and high cost of the inorganic semiconductor material, the organic solar cell has the incomparable advantages that the inorganic solar cell doesn't have, such as wide sources of raw materials, a variety of structures and good regulatability, low cost, safety and environmental protection, simple manufacturing process, light weight, possibly to produce in a large flexibly area, and the like, can be widely used in construction, lighting and power generation and other areas, thus it has an important development and application prospects. Therefore, many domestic and foreign research institutions and enterprises are paying considerable attention and investment to the field of organic solar cell. However, until now, the photoelectric conversion efficiency of the organic solar cell is much lower than that of inorganic solar cell. Therefore, the development of new organic photovoltaic materials has much importance for improving the efficiency of organic solar cells and other semiconductor devices.

SUMMARY

In view of the above question, the present invention provides a porphyrin copolymer containing thienothiadiazole units with broad spectral response, high photoelectric conversion efficiency, and the preparation method of a porphyrin copolymer containing thienothiadiazole units.

The embodiments of the present invention also provide the use of the aforementioned porphyrin copolymer containing thienothiadiazole units in the fields of organic photoelectric materials, solar cell devices, organic field effect transistors, organic electroluminescent devices, organic optical storage devices or organic laser elements.

A porphyrin copolymer containing thienothiadiazole units, the structural formula thereof is as follows:

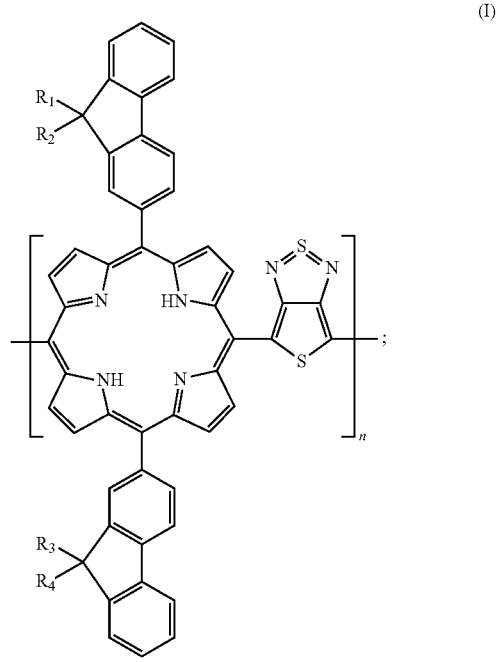

(I)

wherein, $R_1$, $R_2$, $R_3$, $R_4$ are same or different, and each of them represents a $C_1$-$C_{32}$ alkyl, and n is an integer of 1-100.

A preparation method of a porphyrin copolymer containing thieno-thiadiazole units, comprising:

compounds A, B, C and D with the following structural formulae are provided separately:

A:

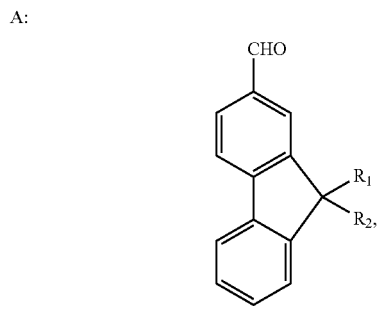

B:

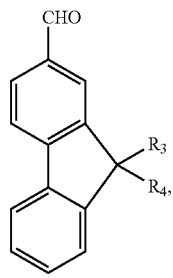

C:

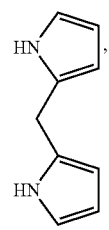

D:

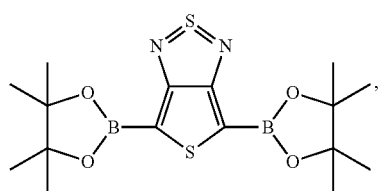

wherein $R_1$, $R_2$, $R_3$ and $R_4$ are same or different, and each of them represents a $C_1$-$C_{32}$ alkyl;

in a system containing a catalyst, an oxidant and an organic solvent, the oxidative condensation of compounds A, B and C are carried out to give the 5,15-bis-(9,9-dialkylfluorene)porphyrin;

in a system containing a catalyst and an organic solvent, the 5,15-bis-(9,9-dialkylfluorene)porphyrin is bromination substituted to give the 5,15-dibromo-10,20-bis(9,9-dialkylfluorene)porphyrin;

with the present of a catalyst and an organic solvent, the Suzuki coupling reaction of 5,15-dibromo-10,20-bis(9,9-dialkylfluorene)porphyrin and compound D is carried out, to give a copolymer of following structural formula (I):

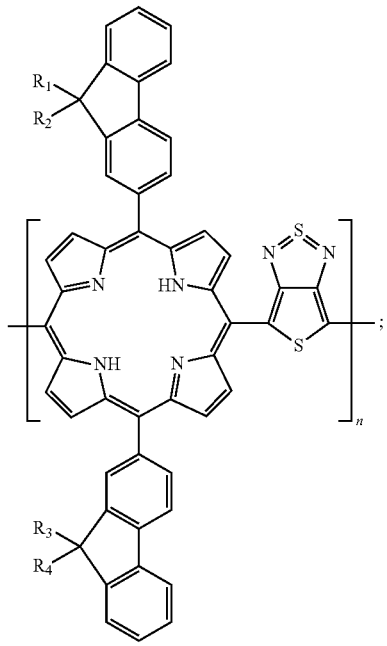

(I)

wherein n is an integer of 1-100.

And the application of aforementioned porphyrin copolymer containing thienothiadiazole units in the fields of organic photoelectric materials, solar cell devices, organic field effect transistors, organic electroluminescent devices, organic optical storage devices or organic laser elements is provided.

In the abovementioned porphyrin copolymer containing thieno-thiadiazole units, the fluorine contained has superior light stability and thermal stability, and has an easy-to-modify structure, so as to improve the dissolubility of the material and to facilitate the membrane performing by introducing alkyl. This copolymer also has a low energy gap, which may increase the density of electron cloud of the backbone of the copolymer, narrow the band gap of the copolymer, so as to broaden the range of the spectral response range of the copolymer. The porphyrin structure endows the copolymer with quantum efficiency of charge transfer and energy transfer reaction, a good property of electron buffer and photoelectro-magnetism, good flexibility, better thermal stability and circumstance stability. The thieno[3,4-c][1,2,5]thiadiazole in the copolymer has a good plane structure, which is benefit for decreasing the band gap, increasing the efficiency of photoelectron conversion. In the aforementioned preparation method of a porphyrin copolymer containing thienothiadiazole units, the synthetic route is easy, thus the process is simplified, and the cost is decreased. The copolymer may be used in the fields of organic photoelectric materials, solar cell devices, organic field effect transistors, organic electroluminescent devices, organic optical storage devices or organic laser elements, in these applications, the copolymer increases the efficiency of the photoelectric conversion, and reduces the weight of the solar cell devices, and the devices may be manufactured in large scale.

BRIEF DESCRIPTION OF THE DRAWINGS

The present invention will be described in detail with reference to the drawings and the Examples, wherein.

DETAILED DESCRIPTION OF THE PREFERRED EMBODIMENTS

Objects, advantages and embodiments of the present invention will be explained below in detail with reference to the accompanying drawings and embodiments. However, it should be appreciated that the following description of the embodiment is merely exemplary in nature and is not intended to limit this invention.

Figure 1:
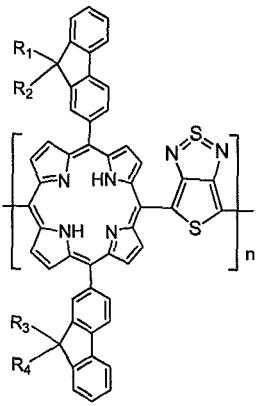
FIG. 1 shows the structural formula of a porphyrin copolymer containing thienothiadiazole units according to the embodiments of the present invention.

Referring to FIG. 1, it shows the structural formula of a porphyrin copolymer containing thienothiadiazole units according to the embodiments of the present invention, the structural formula (I) thereof is as follows:

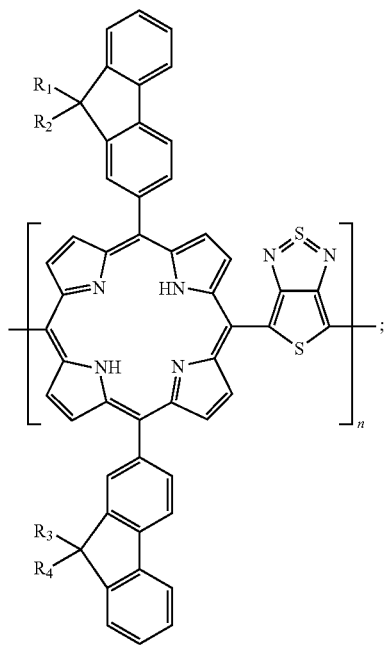

(I)

wherein $R_1$, $R_2$, $R_3$, $R_4$ are same or different, each of them represents a $C_1$-$C_{32}$ alkyl, and n is an integer of 1-100.

In a preferred embodiment, each unit of the porphyrin copolymer containing thienothiadiazole units has two identical fluorenyl group containing alkyl, i.e., for example, $R_1$ and $R_3$ are identical $C_1$-$C_{32}$ alkyls, $R_2$ and $R_4$ are identical $C_1$-$C_{32}$ alkyls, or, in other words, $R_1$ and $R_4$ are identical $C_1$-$C_{32}$ alkyls, $R_2$ and $R_3$ are identical $C_1$-$C_{32}$ alkyls, this symmetrical structure is easy to prepare, and has a high yield. Furthermore, $R_1$ and $R_2$ are identical $C_8$-$C_{32}$ alkyls, and/or $R_3$ and $R_4$ are identical $C_8$-$C_{32}$ alkyls, in this way a long chain alkyl is introduced into the copolymer, and the solubility thereof is improved, and the film processing performance thereof is enhanced. More preferably, each of $R_1$, $R_2$, $R_3$ and $R_4$ represents a $C_8$-$C_{32}$ alkyl. Preferably n is an integer of 10-50. The above-said alkyl may be a straight chain alkyl, branched chain alkyl or ring alkyl.

In the copolymer of above structural formula(I), this copolymer contains the structures of fluorene or derivate thereof, porphyrin and thienothiadiazole units. In this structure, the fluorene or derivate thereof has superior photo-thermal stability and film forming property, and the thienothiadiazole units are introduced into the copolymer to increase the density of the backbone electron cloud of the copolymer, to narrow the band gap of the copolymer, and broaden the spectral absorption range. The porphyrin structure thereof may endow the copolymer with higher efficiency of charge transfer and quantum efficiency of energy transfer reaction, good electron buffering and photoelectromagnetism and good flexibility and thermal stability and environmental stability. The thieno[3,4-c] [1,2,5]thiadiazole in the copolymer has good plane structure, which is an acceptor unit with one five-membered ring and six-membered ring backbone, has the characteristics of intramolecular charge transfer and superior electrochemical reduction. The S . . . N force in the thienothiadiazole unit makes the structure of aggregation state of the polymer ordering, so as to lower bang gap, thereby the thienothiadiazole unit is introduced into the photoelectrical material as an acceptor unit to adjust the band wide and reduction potential in this embodiment. In the photovoltaic material, the acceptor unit thieno[3,4-c] [1,2,5]thiadiazole, which may further lower the band gap, is introduced into the fluorene porphyrin unit for electron donating to form a material with a structure unit of electron donator-acceptor, which also has a high hole mobility and wide sunlight absorption spectrum range, thereby the photoelectricity conversion efficiency is improved.

Figure 2:
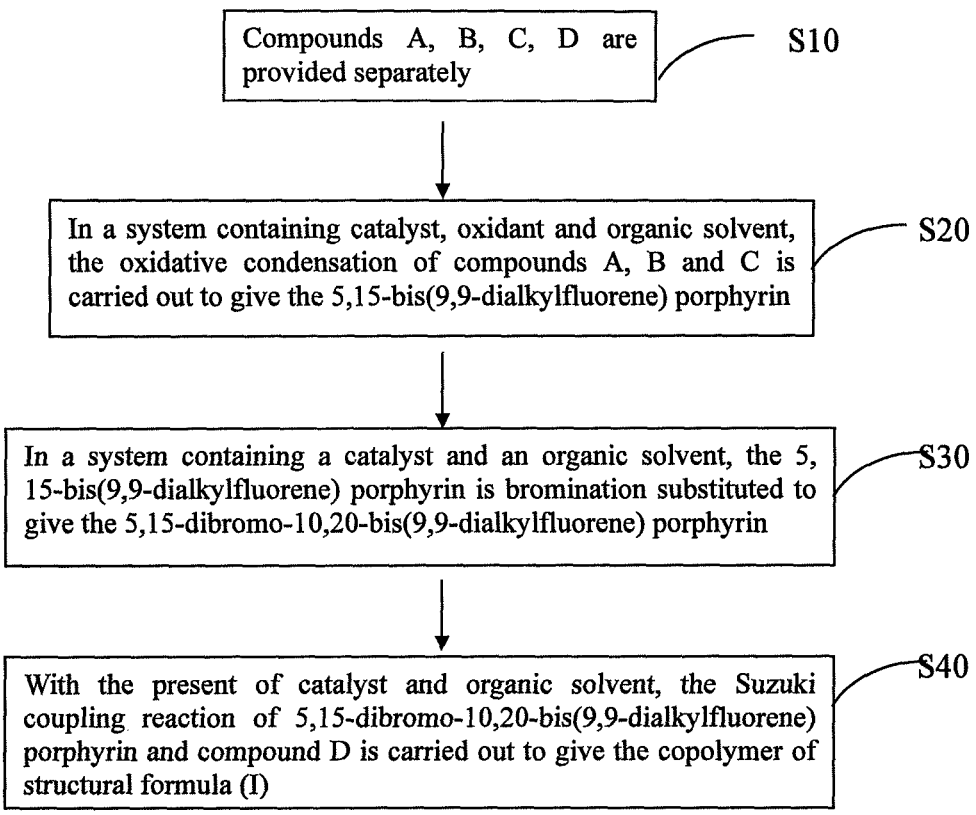
FIG. 2 is a flow chat of the preparation method of the porphyrin copolymer containing thienothiadiazole units according to the embodiments of the present invention.

As a result, the above porphyrin copolymer containing thienothiadiazole units has a wide spectral response range, the wave band thereof is about 280-780 nm, which substantially covers the wave band of visible light, and the copolymer has good thermal stability and environmental stability, with better photoelectrical characteristics, furthermore by means of the synergistic action of fluorene unit, thienothiadiazole unit and porphyrin unit, the photoelectricity conversion efficiency of the copolymer is improved. In the copolymer according to this embodiment, $R_1$, $R_2$, $R_3$, $R_4$ are independently represent $C_1$-$C_{32}$ alkyl, and the solubility thereof is improved by introducing alkyl chain, which facilitates film processing and enlarges the application range thereof Referring to FIG. 2, the preparation method of the above porphyrin copolymer containing thienothiadiazole units comprises following steps:

S01, compounds A, B, C and D of following structural formulae are provided separately,

A:

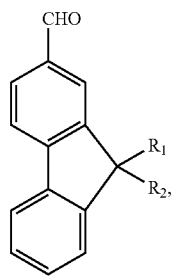

B:

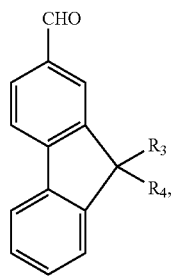

C:

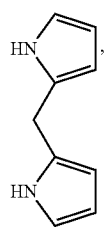

D:

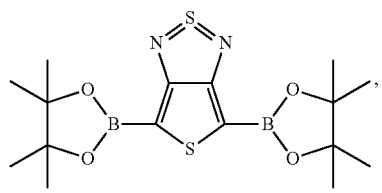

wherein $R_1$, $R_2$, $R_3$, $R_4$ are same or different, and each of them represents a $C_1$-$C_{32}$ alkyl;

S02, in a system containing a catalyst, an oxidant and an organic solvent, the oxidative condensation of compounds A, B and C is carried out to give the 5,15-bis(9,9-dialkylfluorene)porphyrin;

S03, in a system containing a catalyst and an organic solvent, the 5,15-bis(9,9-dialkylfluorene)porphyrin is bromine substituted to obtain 5,15-dibromine-10,20-bis(9,9-dialkylfluorene)porphyrin;

S04, with the present of a catalyst and an organic solvent, the Suzuki coupling reaction of 5,15-dibromine-10,20-bis(9,9-dialkylfluorene)porphyrin and compound D is carried out to obtain the copolymer of formula (I):

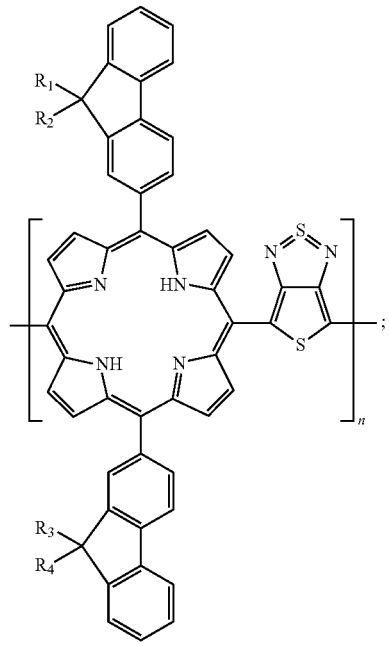

wherein n is an integer of 1-100.

In the step S01, compounds A, B, C, D are commercially available, or may be prepared by the exiting synthesis method. Wherein, $R_1$, $R_2$, $R_3$, $R_4$ has the same structure as the above description about the porphyrin copolymer containing thienothiadiazole units, which will not be described in detail herein. Preferably, n is an integer of 10-50.

In this embodiment, compounds A, B, C, D are prepared separately by following procedure:

1. Preparation of Compounds A and B

Take compound A as an example, the preparation procedure thereof comprises:

Step One, with the present of a catalyst and an organic solvent, the substitution of 2-bromofluorene and bromoalkane is carried out, to give the 9,9-dialkyl-2-bromofluorene. The catalyst is tetrabutylammonium bromide or benzyl triethylammonium chloride and the like, the organic solvent is toluene, dimethyl sulfoxide or tetrahydrofuran and the like. Correspondingly, the bromoalkane is the bromoalkane that the alkyl groups thereof are $R_1$, $R_2$. As shown below, the substitution is carried out in two reaction steps, i.e. steps i and ii, with two bromoalkanes (when $R_1$, $R_2$ are same it is one bromoalkane) being substituted respectively, the reaction route thereof is as follows:

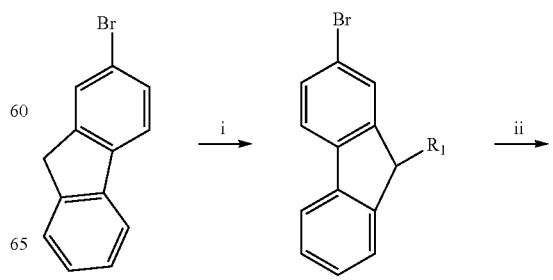

-continued

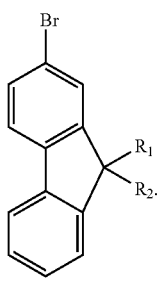

The detailed preparation procedure of 9,9-dialkyl-2-bromofluorene may refer to *Macromolecules*, 2002, 35, 3474.

Step Two, in a system containing an alkyl lithium, a dimethylformamide and an organic solvent, the hydroformylation reaction of the bromo group is carried out, the reaction route is as follows:

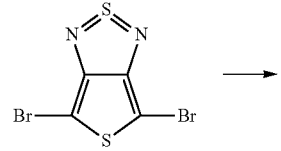

In some specific embodiments, the alkyl lithium is that of $C_2$-$C_4$, and the present embodiment employs the n-butyl lithium, the organic solvent may be tetra-hydrofuran, carbon-tetrachloride or chloroform or the like, the detailed preparation procedure thereof can refer to *Macromolecules*, 2006, 39, 456.

Each step in the preparation of the compound B is substantially the same as the above steps respectively except that the alkyls of the two bromoalkane being replaced by $R_3$ and $R_4$ respectively.

2. Preparation of Compound C

A condensation is carried out in a system containing a formaldehyde, a catalyst and a pyrrole, to obtain the compound C, the reaction formula thereof is as follows:

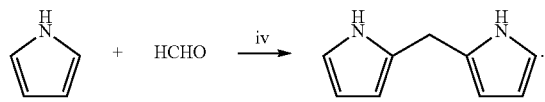

Wherein the catalyst may be trifluoroacetic acid, or boron trifluoride dimethyloxy complex ($BF_3 \cdot (CH_3)_2O$), and the pyrrole acts as both the organic solvent and the reactant in the reaction. The detailed preparation procedure of dipyrromethane i.e. compound C may refer to *Tetrahedron*, 1994, 39, 11427.

3. Preparation of the Compound D

The following substitution is carried out with the present of n-butyl lithium and an organic solvent:

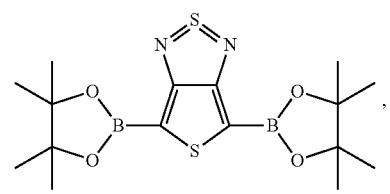

wherein the n-butyl lithium can be replaced by other alkyl lithium, such as, but not limited to, $C_2$-$C_4$ alkyl lithium, the organic solvent may be tetrahydrofuran, carbon tetrachloride or chloroform or the like, preferably it is tetrahydrofuran. The detailed process is as follows: to a reactor, the 9,10-dibromo-thieno[3,4-c][1,2,5]thiadiazol is added, and an organic solvent is added, and the n-butyllithium is injected in under −20 to −78° C., the solution is stirred for 1-12 h, and the 2-isopropoxy-4,4,5,5-tetramethyl-1,3,2-dioxaborolane is injected in under −20 to −78° C., and the mixture is stirred overnight at room temperature (e.g. 12-14 hours). The reaction is terminated by adding saturated aqueous sodium chloride, then extracted with chloroform, dried over anhydrous sodium sulfate. After vacuum filtration the filtrate is collected and the solvent is removed by rotary evaporation. Then the crude product is purified by silica gel column chromatography with petroleum ether/ethyl acetate (15/1) to give the product, i.e. the compound D.

In step S02, the catalyst may be an organic acid, such as, but not limited to trifluoroacetic acid or propionic acid or the like, and the oxidant can be dichloro-dicyanobenzoquinone or an analogue thereof, but not limited thereto, the organic solvent can be dichloromethane, tetrahydrofuran, carbontetrachloride, chloroform, or acetonitrile or the like. The reaction formula thereof is as follows:

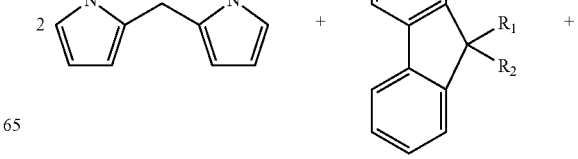

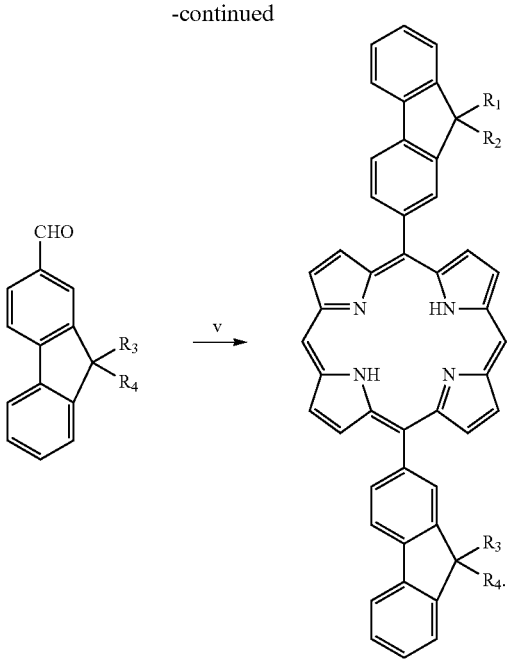

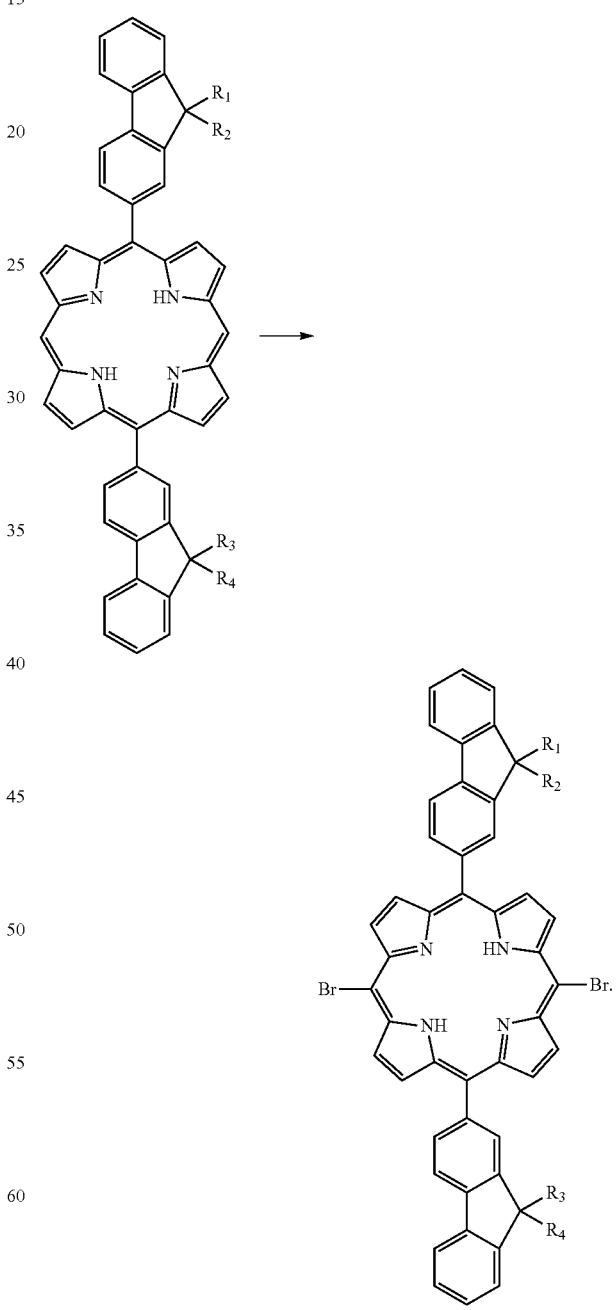

The detailed procedure is as follows: under anhydrous and oxygen-free conditions, the compounds A, B, and C (for example, they are weighed according to the molar ratio of A/B/C of 1/1/2) are dissolved in an organic solvent such as dichloromethane, bubbled with nitrogen, and trifluoroacetic acid is added as the catalyst, the mixture is stirred under 20° C.-100° C. for 1-24 hours, then two molar equivalents (i.e., twice of the reaction stoichiometric ratio) of dichloro-dicyanobenzoquinone (DDQ) was added, and stirred for another 1-60 minutes, then the reaction is quenched by adding triethylamine. Followed by purification as follows: the solvent is concentrated, filtered, and the filtrate is collected and the solvent is removed by rotary evaporation, and the product is purified on silica gel with dichloromethane rapid elution, and the solvent is removed by rotary evaporation, and recrystallized from diethylether/methanol to give the desired product, i.e. the fluorenylporphyrin compound, the yield is above 70%.

In the embodiments of the present invention, the oxygen-free condition involved can be under the protective atmosphere of nitrogen, carbon dioxide or an inert gas, such as under 100% nitrogen, argon, carbon dioxide. The oxygen-free condition can be obtained by a variety of methods, and preferably it is obtained by oil pump evacuation, and then purged with nitrogen, the two steps are repeated 3-4 times, and then purged with nitrogen to make the reaction system under the protection of nitrogen, and maintained the protective gas atmosphere while the reactant was added to the reaction system.

In step S03, in a system containing a catalyst and an organic solvent, the fluorenyl porphyrin compound prepared in the step S02 is bromination substituted to give a compound of dibromo-substituted fluorenyl porphyrin. The organic solvent may be, but not limited to, chloroform, tetrahydrofuran, dimethylformamide (DMF), carbontetrachloride, dichloromethane or acetonitrile and the like, and N-bromo-succinimide (NBS), $Br_2$, HBr or $PBr_3$ may be added as the bromine source, preferably NBS is added.

The detailed procedure of Step S03 is as follows: under anhydrous and oxygen-free condition 5,15-bis(9,9-dialkylfluorene)porphyrin is dissolved in an organic solvent, and an appropriate amount of pyridine is added, then the mixture is cooled to 0° C., an appropriate amount of N-bromo-succinimide is added. Following stirring, the mixture is warmed to 20-40° C., and then stirred for another 1-48 hours, the reaction is terminated by adding acetone. The solvent is removed and the crude product is recrystallized from diethylether/methanol to give the final product in above 80% yield. All of the organic solvents involved in the steps of this embodiment can be weak polar or polar aprotic organic solvent or the mixture thereof, and they are not limited to the specific organic solvent enumerated in each step.

The reaction formula involved in the step S03 is as follows:

In step S04, the catalyst may be an organic palladium catalyst, the amount thereof is 0.05-20% of the molar amount of the compound D. Organic palladium catalyst may be, for example, but not limited to, $Pd_2(dba)_3/P(o-Tol)_3$, $Pd(PPh_3)_4$ or $Pd(PPh_3)_2Cl_2$. Furthermore, the catalyst can also be a mixture of organic palladium and an organic phosphine ligand, wherein they are mixed in a molar ratio of 1:2-20. The organic solvent is a weak polar or polar aprotic organic solvent or the mixture thereof, e.g., it can be, but not limited to, chloroform, dichloromethane, ethylene glycol dimethylether, dimethyl sulfoxide (DMSO), tetrahydrofuran (THF), toluene, xylene or an analog compound, and toluene is preferred. The amount of organic solvent is sufficient to make each of the reactants dissolved and completely reacted. The reaction formula of step S04 is as follows:

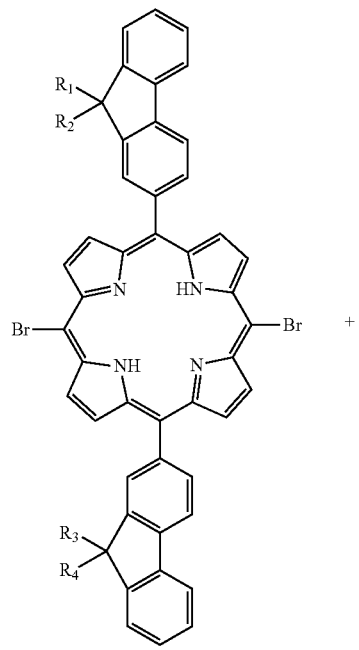

+

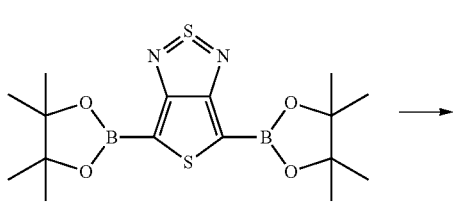

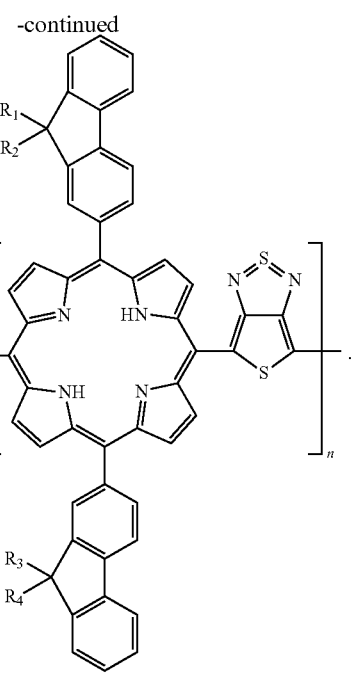

The detailed procedure of step S04 is as follows: under oxygen-free condition, compound D and 5,15-dibromo-10, 20-bis(9,9-dialkyl fluorene)porphyrin are added to an organic solvent in a molar ratio of 1:1.5~1.5:1, the oxygen is removed by evacuation then the reactor is purged with nitrogen, and a catalyst is added, then heated to 50-120° C. for 12-80 hours. After cooling, the mixture is added to an aqueous solution of sodium diethyldithiocarbamate, and then it is heated to 60-80° C. and stirred overnight (about 12-14 hours). Before adding the fluid reactant to an aqueous solution of sodium diethyl dithiocarbamate, the fluid reactant is added dropwise to methanol for sedimentation, followed by vacuum filtration, washing with methanol, dried, and then dissolved in toluene and added to the aqueous solution of sodium diethyl dithiocarbamate sodium formate. After stirring overnight, the purification process is as follows: the organic phase of the final reaction system is passed through alumina column in chromatography, eluted with chlorobenzene, and the organic solvent is removed under reduced pressure, followed by methanol sedimentation, vacuum filtration, and the resulting solid is extracted with acetone in a soxhlet extraction system. Followed by methanol sedimentation, and vacuum filtration. Vacuum filtration is carried out overnight (e.g. 12-14 hours) to give the product. The degree of polymerization n of the resulting copolymer is preferably 10-50. In the actual manufacturing process, the desired degree of polymerization may be obtained by selecting the organic solvent and controling the reaction temperature, reaction time, the added amount of the reactants, the type and amount of catalyst.

In the above process, the synthesis route of compounds A, B, C and D is relatively simple and mature, thereby simplifying the process and reducing the manufacturing cost. And the Suzuki coupling reaction is a very sophisticated polymerization reaction, has the advantages of high yield, mild condition, easy to control, and easy to improve the solubility and molecular weight of the product by introducing alkyl, thus to obtain a spin-coatable polymer.

The porphyrin copolymer containing thienothiadiazole units of this embodiment may be used as an organic photoelectric materials, applied in all kinds of photoelectric or semiconductor devices, e.g. applied in solar cell devices, organic field effect transistors, organic electroluminescent devices, organic optical storage devices or organic laser devices. Wherein the organic photoelectric material i.e. the above porphyrin copolymer containing thienothiadiazole units, may be used as an electron donor material or the photoelectric conversion material and the like. Below take the solar cell device, organic field effect transistor, organic electroluminescent device as examples to explain the description. Other devices, such as organic optical storage device, an organic nonlinear material and organic laser device are similar to following description, all of them employing the porphyrin copolymer containing thienothiadiazole units of the present embodiment as its optical storage materials, laser or semiconductor material and so on.

Figure 3:
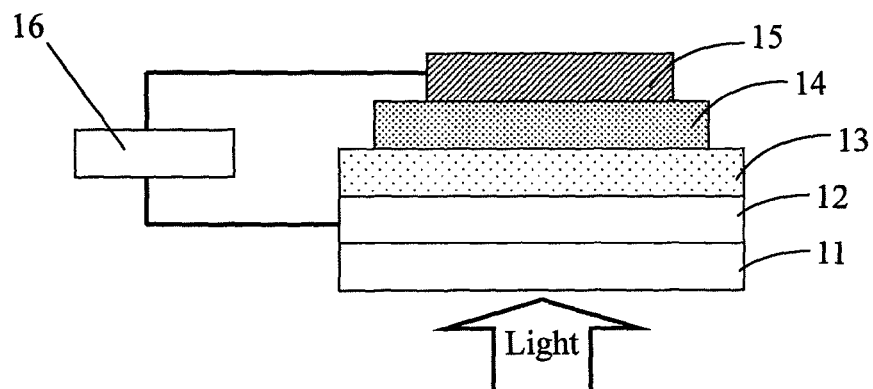
FIG. 3 is a structural schematic view of a solar cell device employing the porphyrin copolymer containing thienothiadiazole units according to the embodiment of the present invention.

Referring to FIG. 3, a solar cell device employing the porphyrin copolymer containing thienothiadiazole units of the above embodiment is shown, it contains a glass substrate 11, a transparent anode 12, an intermediate auxiliary layer 13, an active layer 14, and a cathode 15 in a sequentially laminated structure, wherein the intermediate auxiliary layer 13 employs polyethylene dioxythiophene: polystyrene-sulfonic acid composite (abbreviated as PEDOT: PSS), the active layer 14 includes an electron donor material and an electron acceptor material, the electron donor material employing the above porphyrin copolymer containing thienothiadiazole units, the electron acceptor material may be [6,6]-phenyl-$C_{61}$-butyric acid methyl ester (PCBM). The transparent anode 12 may be made of indium tin oxide (abbreviated as ITO), an indium tin oxide with the sheet resistance of 10-20Ω/□ is preferred. The cathode 15 may be made of aluminum. Wherein the glass substrate 11 can be used as the bottom layer, during production, firstly the ITO electrode is deposited on the glass substrate 11, then the intermediate auxiliary layer 13 is formed on the ITO electrode by oxygen-Plasma spraying process, and the porphyrin copolymer containing thienothiadiazole units and electron acceptor material are deposited on the intermediate auxiliary layer 13 by spin coating, to form the active layer 14, and then the cathode 15 is deposited on the active layer 14 by vacuum deposition, to obtain the above solar cell device.

As shown in FIG. 3, under the illumination of light, the light passes through the glass substrate 11 and the ITO electrodes 12, the porphyrin copolymer containing thienothiadiazole units in the active layer 14 absorbs light energy, and generates excitons, these excitons then migrate to the interface of the electron donor/acceptor material, and transfer electron to the electron acceptor material, such as PCBM, so as to achieve the separation of the charge, thereby forming free carrier, i.e. free electrons and holes. These free electrons move to the metal cathode along the electron acceptor material and they are collected by the cathode, the free holes are passed to the ITO anode along the electron donor material and collected by the anode, thereby forming photocurrent and photovoltage, so as to achieve the photoelectric conversion. When a load 16 is connected to the solar cell device, it can be powered. In this process, the porphyrin copolymer containing thienothiadiazole units may utilize light energy more sufficiently as it has very broad spectral response range, thus to obtain higher photoelectric conversion efficiency, and increase the electrogenesis capacity of the solar cell device. And this organic material can also reduce the weight of the solar cell device, and can be produced by spin coating techniques, to facilitate the preparation in large scale.

Figure 4:
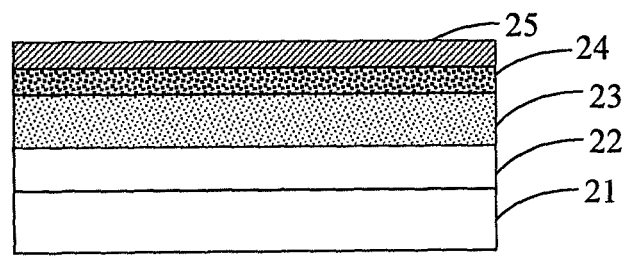
FIG. 4 is a structural schematic view of an organic electroluminescent device employing the porphyrin copolymer containing thienothiadiazole units according to the embodiment of the present invention.

Referring to FIG. 4, an organic electroluminescent device employing the porphyrin copolymer containing thienothiadiazole units of the above embodiments is shown, it comprises a glass substrate 21, a transparent anode 22, the light-emitting layer 23, the buffer layer 24, a cathode 25 in a sequentially laminated structure. The transparent anode 22 may be made of indium tin oxide (abbreviated as ITO), preferably an indium tin oxide with sheet resistance of 10-20Ω/□. The light emitting layer 23 includes the porphyrin copolymer containing thienothiadiazole units of the above embodiments. The buffer layer 24 may be made of LiF and the like, but not limited thereto. The cathode 25 can be made of, but not limited to the metal of Al or Ba and the like, but not limited thereto. Thus, in a particular embodiment, the structure of the organic electroluminescent device may be represented as follows: ITO/the porphyrin copolymer containing thienothiadiazole units/LiF/Al. All of the layers may be formed by existing methods, and the porphyrin copolymer containing thienothiadiazole units may be formed on the ITO by spin coating.

Figure 5:
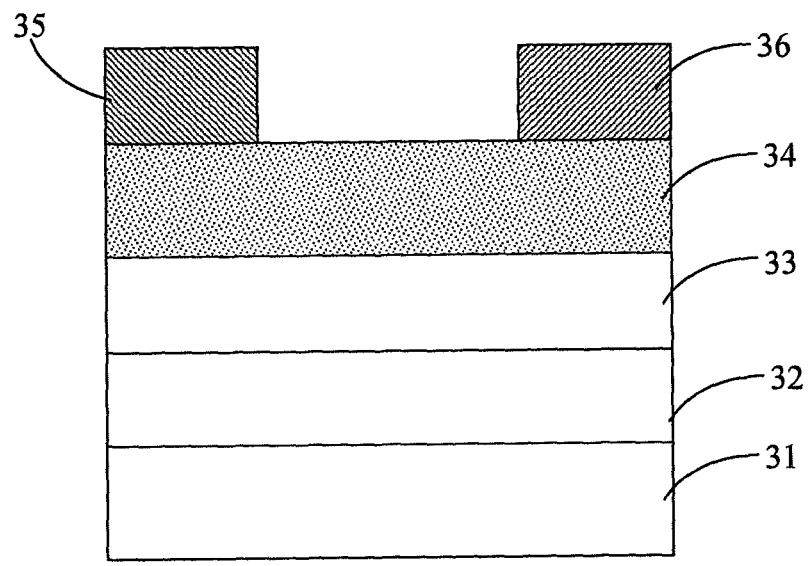
FIG. 5 is a structural schematic view of an organic field effect transistor employing the porphyrin copolymer containing thienothiadiazole units according to the embodiment of the present invention.

Referring to FIG. 5, an organic field effect transistor employing the porphyrin copolymer containing thienothiadiazole units of the above embodiments is shown, it contains a substrate 31, an insulating layer 32, a modified layer 33, an organic semiconductor layer 34, as well as a source electrode 35 and a drain electrode 36 provided on the organic semiconductor layer 34. Wherein the substrate 31 may be, but not limited to high-doped silicon (Si), the insulating layer 32 may be, but not limited to $SiO_2$ with micro-nanometer (such as 450 nm) thick. The organic semiconductor layer 34 employs the above porphyrin copolymer containing thienothiadiazole units. The source electrode 35 and the drain electrode 36 may be made of, but not limited to, gold. The modified layer 33 may be made of, but not limited to, octadecyl-trichlorosilane. The substrate 31, the insulating layer 32, the modified layer 33 as well as the source electrode 35 and the drain electrode 36 may be formed by existing methods. The organic semiconductor layer 34 may be formed by spin coating the porphyrin copolymer containing thienothiadiazole units of the above embodiments on the modified layer 33 which modifying the insulating layer 32.

The porphyrin copolymer containing thienothiadiazole units, the preparation method and the performance thereof will be illustrated with reference to specific examples.

EXAMPLE 1

The present Example 1 provides 10,20-bis(9,9-dioctylfluorene)porphyrin-thieno[3,4-c] [1,2,5] thiadiazole copolymer with following structure, the structural formula of the polymer is shown as the product of the reaction formula in step 4. The preparation process of the above polymer is as follows:

1. Preparation of 5,7-bis(4,4,5,5-tetramethyl-1,3,2-dioxaborolan)-yl-thieno[3,4-c] [1,2,5] thiadiazole, the Reaction Formula Thereof is as Follows

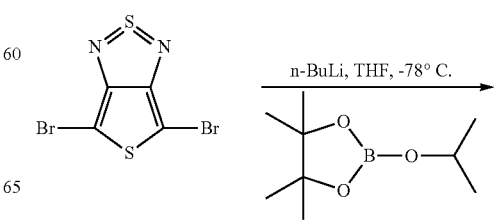

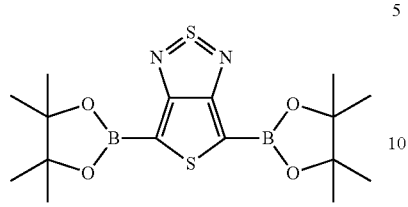

The detailed procedure is: under the protection of nitrogen, to a three-necked flask was added 9,10-dibromo-thieno[3,4-c][1,2,5]thiadiazole (9.0 g, 0.03 mol), and added 200 ml of tetrahydrofuran as a solvent, then was injected n-butyllithium (25.2 mL, 2.5 M, 0.06 mol) slowly by a syringe at −78° C. with stirring for 2 h, and was injected 2-isopropoxyl-4,4,5,5-tetramethyl-1,3,2-dioxaborolane (13 mL, 0.06 mol) by a syringe at −78° C., and the mixture was stirred at room temperature overnight. The reaction was terminated by adding saturated aqueous sodium chloride (30 ml). Then extracted with chloroform, dried over anhydrous sodium sulfate. After vacuum filtration the filtrate was collected and the solvent was removed by rotary evaporating. Finally, the crude product was purified by chromatography on a silica gel column with petroleum ether/ethyl acetate (15/1) to give the product in 92% yield.

2. Preparation of 10,20-bis(9,9-dioctylfluorene)porphyrin

As $R_1$, $R_2$, $R_3$, $R_4$ the same and each represents an octyl, the raw materials compounds A and B used in this step are identical, it may have a higher yield and purity of the product in this situation, the reaction formula tereof is as follows:

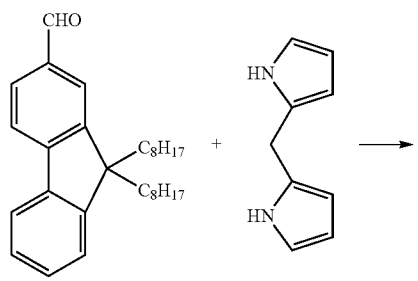

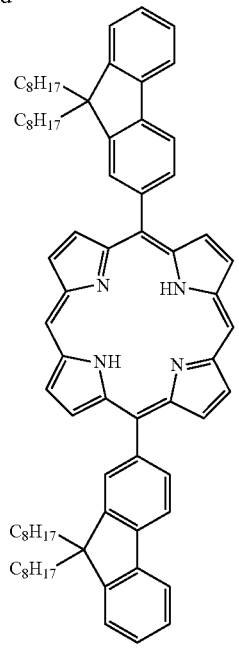

The detailed procedure is: an anhydrous and oxygen-free means was equipped, the intermediates 9,9-dioctyl-2-aldehyde fluorene (0.42 g, 1 mmol) and dipyrromethane (0.15 g, 1 mmol) were weighed and dissolved in 300 ml of dichloromethane and bubbled with nitrogen for 30 min, then 1 ml of propionic acid was injected by syringe, and stirred at 20° C. for 24 h, then added dichloro-dicyano benzoquinone (DDQ) (0.91 g, 4 mmol) and stirred at room temperature for another 30 min The reaction was quenched by adding 1 ml of triethylamine, and the solvent was concentrated, filtered, the filtrate was collected and the solvent was removed by rotary evaporating, then eluted quickly with dichloromethane on a silica gel column, then the solvent was removed by rotary evaporating, it was recrystallized from diethyl ether/methanol to a product in about 75% yield.

3. Preparation of 5,15-dibromo-10,20-bis(9,9-dioctylfluorene)porphyrin, the Reaction Formula of this Step is as Follows

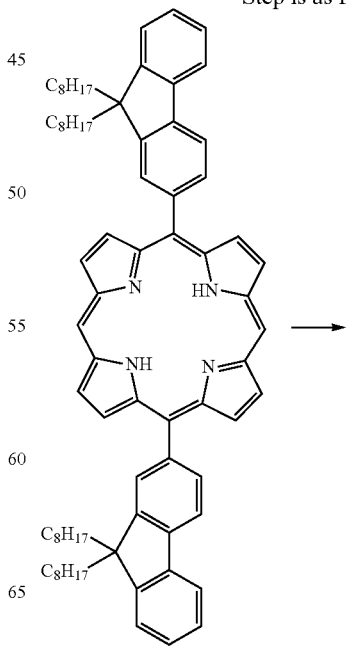

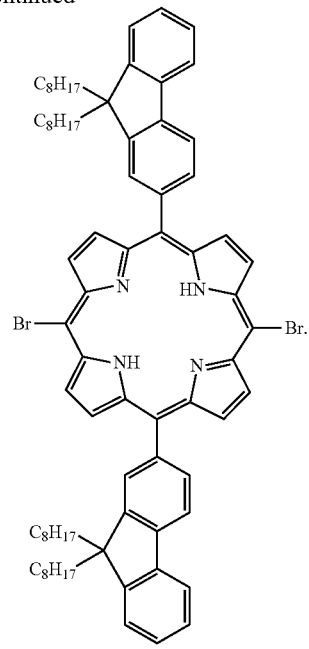

The detailed procedure is: an anhydrous and oxygen-free means was equipped, 10,20-bis(9,9-dioctylfluorene)porphyrin (0.22 g, 0.2 mmol) was weighed and dissolved in 80 ml of chloroform, and 1 ml of pyridine was added, the solution was cooled to 0° C. Then it was added N-bromo succinimide (0.07 g, 0.4 mmol), and stirred for 72 h. The mixture was warmed to room temperature, and then stirred for another 4 h. The reaction was terminated by adding 5 ml of acetone, the solvent was removed, the resulting product was recrystallized from diethyl ether/methanol to give the final product in 86% yield.

4. Preparation of the Copolymer of 10,20-bis(9,9-dioctylfluorene)porphyrin-thieno[3,4-c] [1,2,5], the Reaction Formula Involved is as Follows

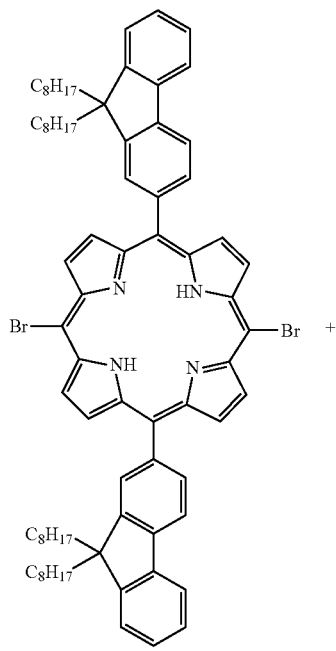

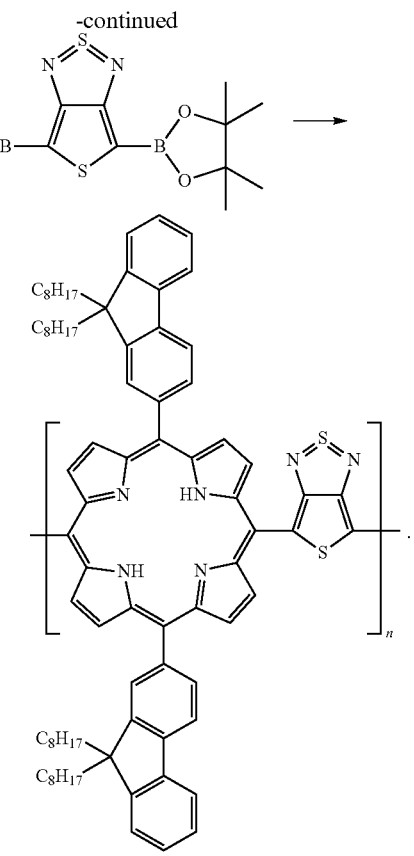

The detailed procedure is: under nitrogen 5,7-bis(4,4,5,5-tetramethyl-1,3,2-dioxaborolan)ylthieno[3,4-c] [1,2,5]thiadiazole (79 mg, 0.2 mmol), 5,15-dibromo-10,20-bis(9,9-dioctylfluorene)porphyrin (250 mg, 0.2 mmol) and 40 ml of toluene as a solvent were added, the reactor was evacuated to remove the oxygen and then purged with nitrogen, and then added 5 mg Pd(PPh$_3$)$_2$Cl$_2$, the solution was heated to 100° C. for 56 h. After cooled to room temperature, the mixture was added dropwise to 200 ml of methanol for sedimentation. It was vacuum filtrated, washed with methanol, and dried, then dissolved in toluene and added to an aqueous solution of sodium diethyldithiocarbamate, and then the mixture was heated at 80° C. and stirred overnight. The organic phase obtained was passed through alumina in chromatography, eluted with chlorobenzene. The organic solvent was removed under reduced pressure, the product was added to methanol for sedimentation. After filtration, the resulting solid was extracted with acetone in Soxhlet extraction system for three days. Then it was added to methanol for sedimentation, and vacuum filtrated. After vacuum filtration with vacuum pump overnight the product was obtained in 78% yield. Test result of Molecular weight: (GPC, THF, R. I): Mn=39600, Mw/Mn=3.52;)

EXAMPLE 2

This Example 2 provides the copolymer of 10-(9-methyl-9-dioctyl fluorene)-20-(9-decyl-9-hexadecylfluorene)porphyrin-thieno[3,4-C] [1,2,5]thiazole with following structure, the structural formula of the polymer is shown as the product of the reaction formula in step 4. The above polymer was prepared as follows:

1. 5,7-bis(4,4,5,5-tetramethyl-1,3,2-dioxaborolan)yl thieno[3,4-c] [1,2,5]thiadiazol The preparation process is the same as Example 1.

2. Preparation of 10-(9-methyl-9-octylfluorene)-20-(9-decyl-9-hexadecyl fluorene)porphyrin, the Reaction Formula Involved is as Follows

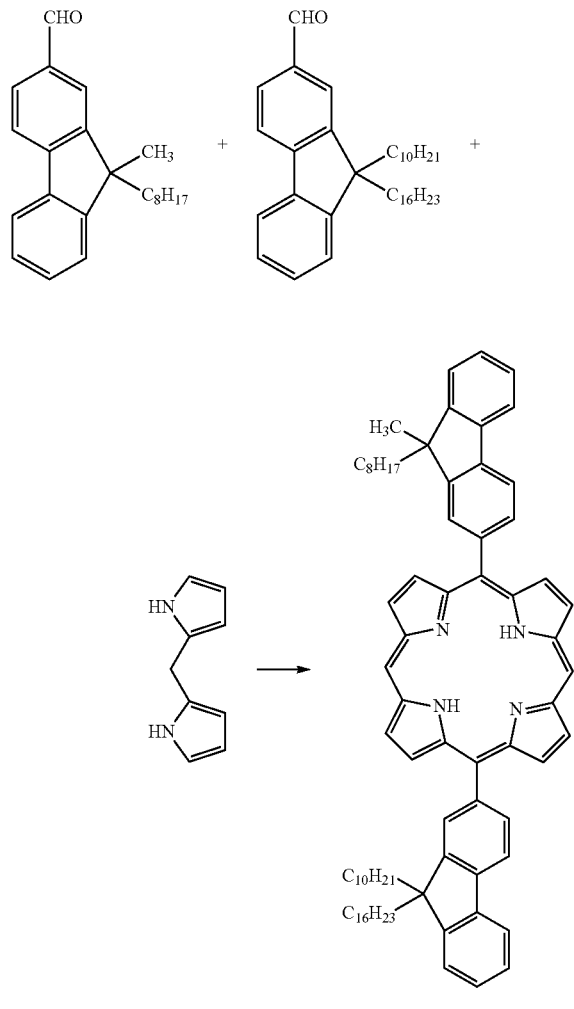

The detailed procedure is: an anhydrous and oxygen-free means was equipped, the intermediates 9-methyl-9-octylfluorene (0.32 g, 1 mmol), 9-decyl-9-hexadecyl fluorene (0.56 g, 1 mmol) and dipyrromethane (0.30 g, 2 mmol) were weighed and dissolved in 250 ml of dichloromethane and bubbled with nitrogen for 30 min, then 2 ml of trifluoroacetic acid was added by syringe, and stirred at 100° C. for 1 h, then added dichloro-dicyano benzoquinone (DDQ) (1.82 g, 8 mmol) and stirred at room temperature for another 30 min. The reaction was quenched by adding 2 ml of pyridine, and the solvent was concentrated, filtered, and the filtrate was collected and the solvent was removed by rotary evaporating, then eluted quickly with dichloromethane on a silica gel column, and the solvent was removed by rotary evaporating, recrystallized from diethylether/methanol to a product in about 71% yield.

3. Preparation of 5,15-dibromo-10-(9-methyl-9-octylfluorene)-20-(9-decyl-9-hexadecyl fluorene)porphyrin, the Reaction Formula Involved in This Step is as Follows

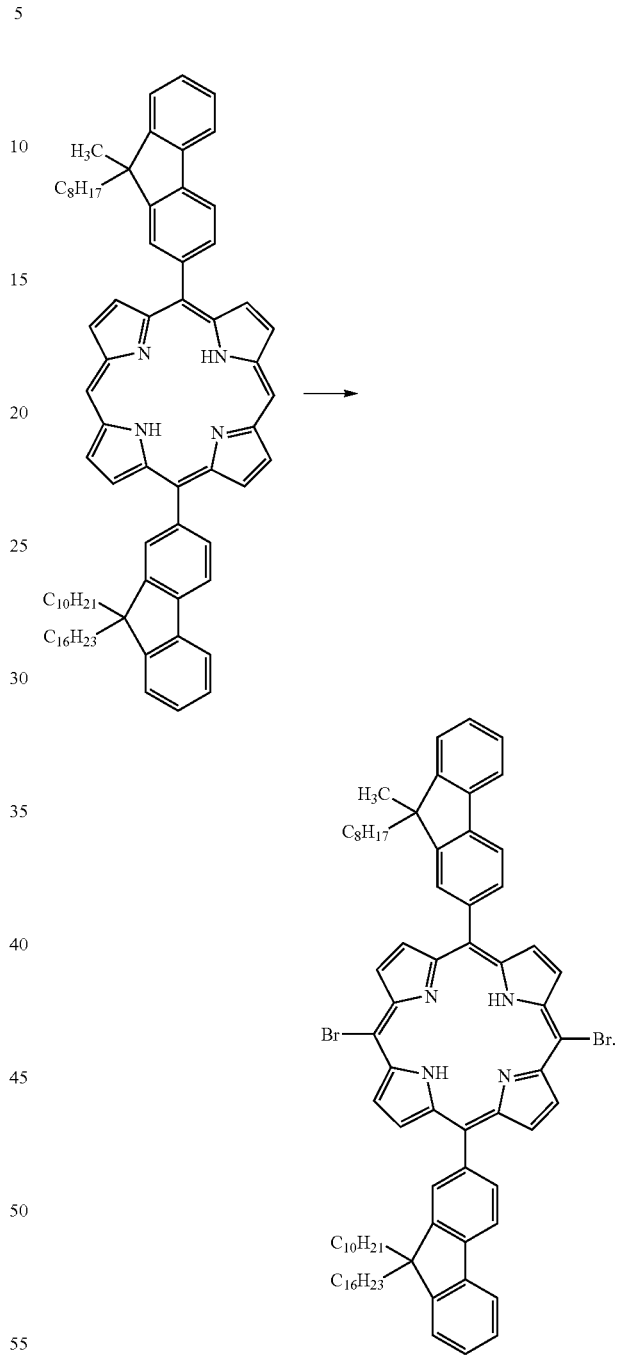

The detailed procedure is: an anhydrous and oxygen-free means was equipped, 10-(9-methyl-9-octylfluorene)-20-(9-decyl-9-hexadecyl fluorene)porphyrin (0.23 g, 0.2 mmol) was weighed and dissolved in 80 ml of chloroform, and 1 ml of pyridine was added, the solution was cooled to 0° C., added N-bromo-succinimide (0.07 g, 0.4 mmol) and stirred for 0.5 h, then the mixture was warmed to 120° C. and stirred for another 1 h, the reaction was terminated by adding 5 ml of acetone, the solvent was removed, the resulting product was recrystallized from diethylether/methanol to give the final product in 81% yield.

4. Preparation of the Copolymer of 10-(9-methyl-9-octylfluorene)-20-(9-decyl-9-hexadecyl fluorene) porphyrin-thieno[3,4-c] [1,2,5]thiadiazol, the Reaction Formula Involved is as Follows

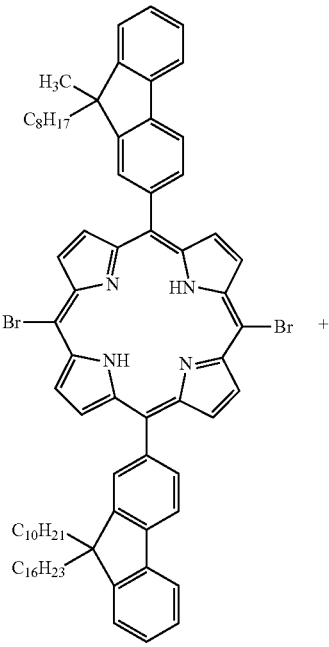

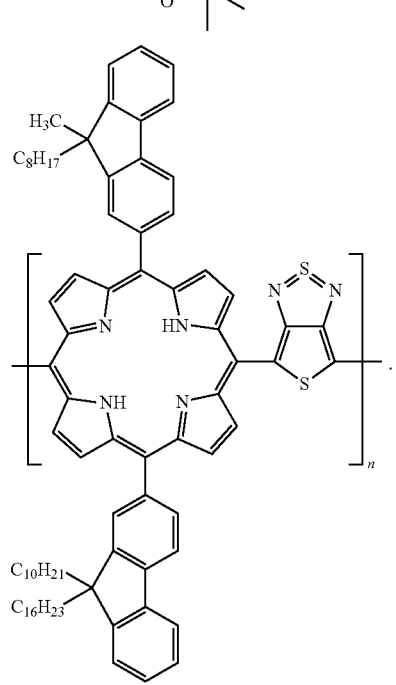

The detailed procedure is: under nitrogen 5,7-bis(4,4,5,5-tetramethyl-1,3,2-dioxaborolan)yl thieno[3,4-c] [1,2,5]thiadiazole (79 mg, 0.2 mmol), 5,15-dibromo-10-(9-methyl-9-octylfluorene)-20-(9-decyl-9-hexadecyl fluorene)porphyrin (260 mg, 0.2 mmol) and 100 ml of toluene as a solvent were added, the reactor was evacuated to remove the oxygen and then purged with nitrogen, and then added a solution of Pd(OAc)$_2$ (2.5 mg)/tricyclohexyl phosphine (6.5 mg) and 2 ml 20% (wt) Et$_3$NOH, then heated to 120° C. for 24 h. After cooled to room temperature, the mixture was added dropwise to 200 ml of methanol for sedimentation. It was vacuum filtrated, washed with methanol, and dried, then dissolved in toluene and added to an aqueous solution of sodium diethyldithiocarbamate, and then the mixture was heated to 80° C. and stirred overnight. The organic phase obtained was passed through alumina in chromatography, eluted with chlorobenzene. The organic solvent was removed under reduced pressure, the product was added to methanol for sedimentation. After vacuum filtration, the resulting solid was extracted with acetone in Soxhlet extraction system for three days. Then it was added to methanol for sedimentation, and vacuum filtrated. After vacuum filtration with vacuum pump overnight the product was obtained in 76% yield. Test result of Molecular weight: (GPC, THF, R. I): Mn=42800, Mw/Mn=4.33;)

EXAMPLE 3

This Example 3 provides the copolymer of 10-(9-methyl-9-tridodecyl fluorene)-20-(9,9-bis(hexadecylfluorene))porphyrin-thieno[3,4-c] [1,2,5]thiadiazol with following structure, the structural formula of the copolymer is shown as the product of the reaction formula in step 4. The above polymer was prepared as follows:

1. 5,7-bis(4,4,5,5-tetramethyl-1,3,2-dioxaborolan)yl thieno[3,4-c][1,2,5]thiadiazol The preparation process is the same as Example 1.

2. Preparation of 10-(9-methyl-9-tridodecyl fluorene)-20-(9,9-bis(hexadecyl fluorene))porphyrin, the Reaction Formula Involved is as Follow

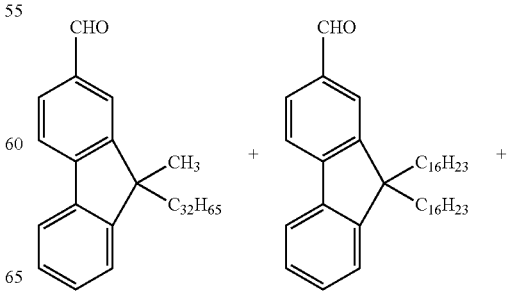

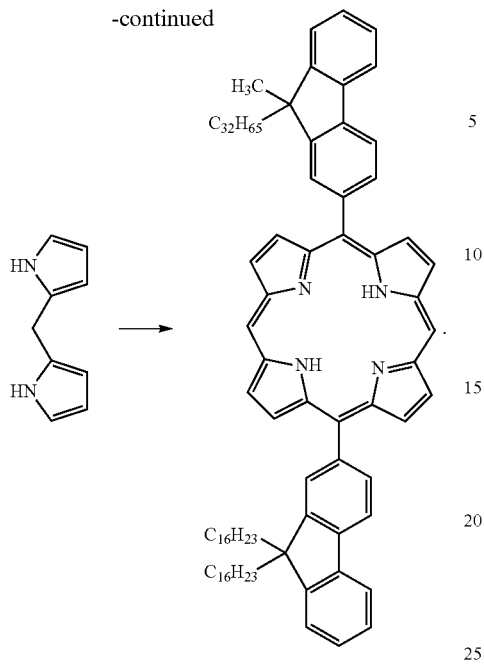

The detailed procedure is: an anhydrous and oxygen-free means was equipped, the intermediates 9-methyl-9-tridodecyl fluorene (0.66 g, 1 mmol), 9,9-bis(hexadecyl fluorene) (0.64 g, 1 mmol) and dipyrromethane (0.30 g, 2 mmol) were weighed and dissolved in 300 ml of dichloromethane and bubbled with nitrogen for 30 min, then 2 ml of trifluoroacetic acid was added, and stirred at room temperature for 3 h, then added dichloro-dicyano benzoquinone (DDQ) (1.82 g, 8 mmol) and stirred at room temperature for another 30 min. The reaction was quenched by adding 2 ml of triethylamine, and the solvent was concentrated, filtered, and the filtrate was collected and the solvent was removed by rotary evaporating, then eluted quickly with dichloromethane on a silica gel column, and the solvent was removed by rotary evaporating, recrystallized from diethylether / methanol to a product in about 85% yield.

3. Preparation of 5,15-dibromo-10-(9-methyl-9-tridodecylfluorene)-20-(9,9-bis(hexadecyl fluorene)) porphyrin, the Reaction Formula Involved in This Step is as Follows

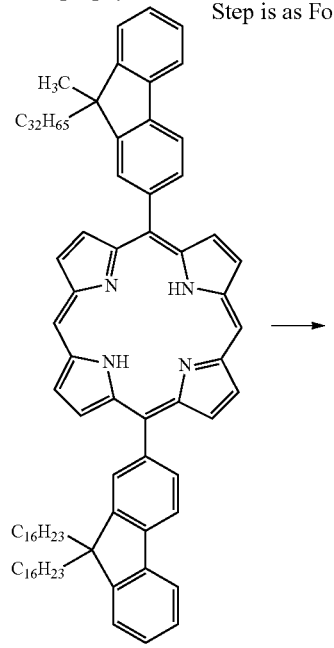

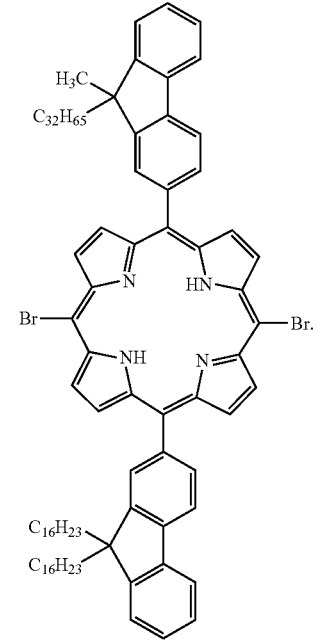

The detailed procedure is: an anhydrous oxygen-free means was equipped, 10-(9-methyl-9-tridodecylfluorene)-20-(9,9-bis(hexadecyl fluorene))porphyrin (0.31 g, 0.2 mmol) was weighed and dissolved in 100 ml of chloroform, and 1 ml of pyridine was added, the solution was cooled to 0° C. It was added N-bromo-succinimide (0.07 g, 0.4 mmol) and stirred for 0.5 h, then the mixture was warmed to 30° C. and stirred for another 48 h, the reaction was terminated by adding 5 ml of acetone, the solvent was removed, the resulting product was recrystallized from diethylether/methanol to give the final product in 82% yield.

4. Preparation of the Copolymer of 10-(9-methyl-9-tridodecyl fluorene)-20-(9,9-bis(hexadecylfluorene)) porphyrin-thieno[3,4-c] [1,2,5]thiadiazol, the Reaction Formula Involved is as Follows

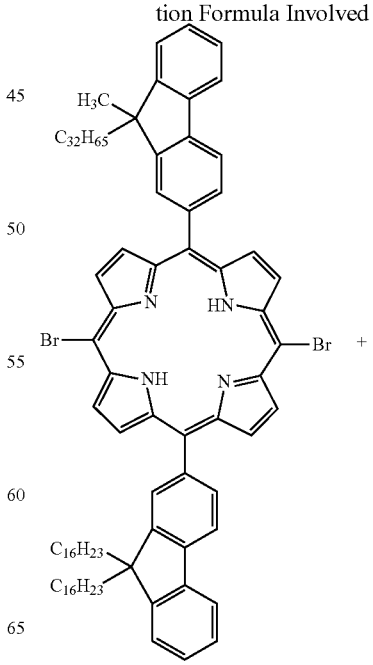

-continued

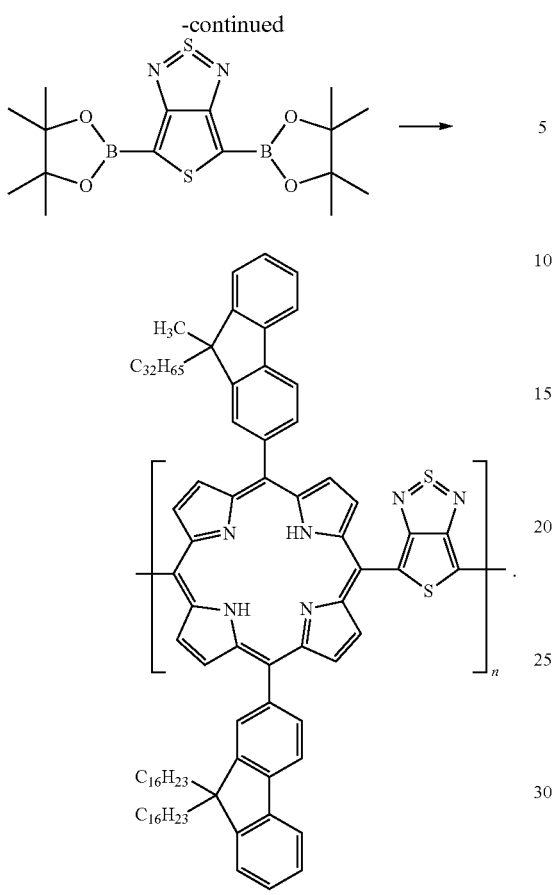

The detailed procedure is: under the protection of nitrogen, 5,7-bis(4,4,5,5-tetramethyl-1,3,2-dioxaborolan)yl thieno[3,4-c][1,2,5]thiadiazole (79 mg, 0.2 mmol), 5,15-dibromo-10-(9-methyl-9-tridodecylfluorene)-20-(9,9-bis(hexadecyl fluorene))porphyrin(343 mg, 0.2 mmol) and 80 ml of toluene as a solvent were added, the reactor was evacuated to remove the oxygen and then purged with nitrogen, and then added 8 mg of Pd(PPh$_3$)$_4$, and warmed to 50° C. for 72 h. After cooled to room temperature, the mixture was added dropwise to 250 ml of methanol for sedimentation. It was vacuum filtrated, washed with methanol, and dried, then dissolved in toluene and added to an aqueous solution of sodium diethyldithiocarbamate, then the mixture was heated to 80° C. and stirred overnight. The organic phase obtained was passed through alumina in chromatography, eluted with chlorobenzene. The organic solvent was removed under reduced pressure, the resulting product was added to methanol for sedimentation. After vacuum filtration, the resulting solid was extracted with acetone in Soxhlet extraction system for three days. Then it was added to methanol for sedimentation, and vacuum filtrated. After vacuum filtration with vacuum pump overnight the product was obtained in 76% yield. The test result of Molecular weight is: (GPC, THF, R. I): Mn=38100, Mw/Mn=3.62;).

The embodiments above are merely the preferable embodiments of the present invention and not intended to limit the present invention. And all changes, equivalent substitution and improvements which come within the meaning and range of equivalency of the present invention are intended to be embraced therein.

What is claimed is:

1. A porphyrin copolymer containing thienothiadiazole units, which has the structural formula (I):

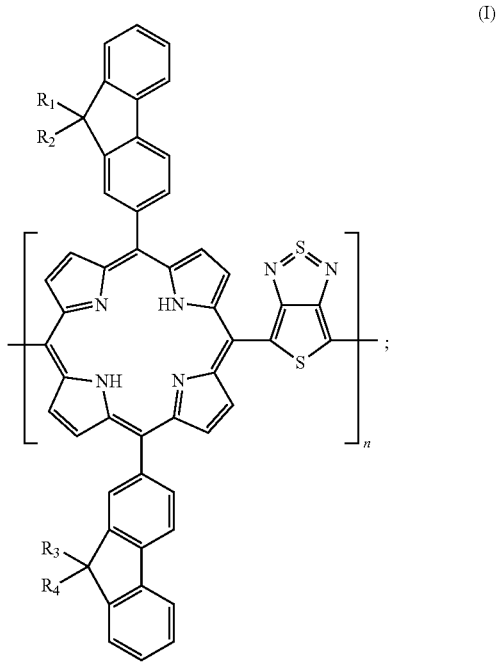

(I)

wherein, $R_1$, $R_2$, $R_3$, $R_4$ are same or different and each represents a $C_1$-$C_{32}$ alkyl, and n is an integer of 1-100.

2. The porphyrin copolymer containing thienothiadiazole units of claim 1, wherein each unit of the porphyrin copolymer containing thienothiadiazole units has two identical fluorenyl group containing alkyl.

3. The porphyrin copolymer containing thienothiadiazole units of claim 1, wherein the $R_1$, $R_2$, $R_3$ and $R_4$ are same and each represents a $C_8$-$C_{32}$ alkyl.

4. The porphyrin copolymer containing thienothiadiazole units of claim 1, wherein n is an integer of 10-50.

5. A preparation method of a porphyrin copolymer containing thienothiadiazole units, comprising:

compounds A, B, C and D with following structural formulae are provided separately:

A:

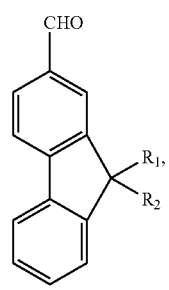

B:

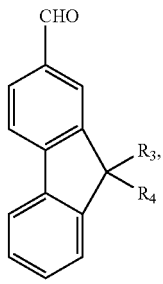

C:

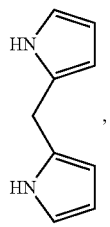

D:

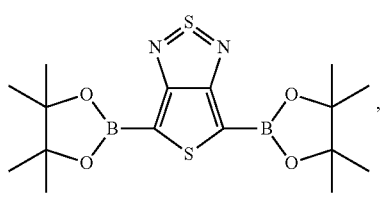

wherein R₁, R₂, R₃ and R₄ are same or different, and each of them represents a $C_1$-$C_{32}$ alkyl;

in a system containing a catalyst, an oxidant and an organic solvent, the oxidative condensation of compounds A, B and C is carried out to give the 5,15-bis(9,9-dialkyl fluorene) porphyrin;

in a system containing a catalyst and an organic solvent, the 5,15-bis (9,9-dialkyl fluorene)porphyrin is bromination substituted to give the 5,15-dibromo- 10,20-bis (9,9-dialkylfluorene) porphyrin;

with the present of a catalyst and an organic solvent, the Suzuki coupling reaction of 5,15-dibromo-10,20-bis(9, 9-dialkylfluorene) porphyrin and compound D is carried out to give the copolymer of following structural formula (I):

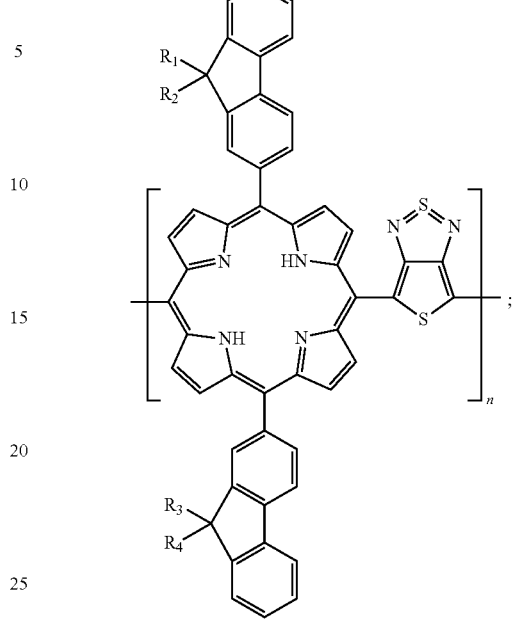

(I)

wherein n is an integer of 1-100.

6. The preparation method of a porphyrin copolymer containing thienothiadiazole units of claim 5, wherein the procedure of the said oxidative condensation includes: under anhydrous and oxygen-free conditions, compounds A, B, and C are dissolved in an organic solvent, an organic acid is added as the catalyst, the mixture is stirred under 20° C-100° C. for 1-24 hours, dichloro dicyanobenzoquinone (DDQ) is added as the oxidant, and stirred for another 1-60 minutes, the reaction is quenched by adding triethylamine, and the product is obtained following purification.

7. The preparation method of a porphyrin copolymer containing thienothiadiazole units of claim 5, wherein the procedure of the said Suzuki coupling reaction includes: under oxygen-free condition, compound D and 5,15-dibromo-10, 20-bis (9,9- dialkyl fluorene) porphyrin are added to an organic solvent in a molar ratio of 1:1.5~1.5: 1, the oxygen is removed by evacuation then nitrogen is purged in, and a catalyst is added, the mixture is heated to 50-120° C. for 12-80 hours, after cooling, the mixture is added to an aqueous solution of sodium diethyldithiocarbamate, then the mixture is heated with stirring at 60-80° C. for 12-14 hours.

8. The preparation method of a porphyrin copolymer containing thienothiadiazole units of claim 5, wherein the R₁, R₂, R₃ and R₄ are same and each represents a $C_8$-$C_{32}$ alkyl, the n is an integer of 10-50.

9. The preparation method of a porphyrin copolymer containing thienothiadiazole units of claim 5, wherein the catalyst in the said Suzuki coupling reaction is an organic palladium or a mixture of organic palladium and an organic phosphine ligand in a molar ratio of 1:2-20, the molar amount of the catalyst in the said Suzuki coupling reaction is 0.05-20% of the molar amount of the compound D, and the organic solvent is a weak polar or polar aprotic organic solvent or the mixture thereof.

10. An organic photoelectricity material, solar cell device, organic field effect transistor, organic electro- luminescent device, organic optical storage device or organic laser element containing the porphyrin copolymer containing thienothiadiazole units of claim 1.

\* \* \* \* \*